(12) United States Patent
Kolchanov et al.

(10) Patent No.: US 10,557,341 B2
(45) Date of Patent: Feb. 11, 2020

(54) METHODS OF EVALUATING CEMENT ISOLATIONS AND QUALITY

(71) Applicant: SCHLUMBERGER TECHNOLOGY CORPORATION, Sugar Land, TX (US)

(72) Inventors: Petr Kolchanov, Sugar Land, TX (US); Gunnar Gerard De Bruijn, Houston, TX (US); Dmitriy Potapenko, Sugar Land, TX (US); Jesse Lee, Sugar Land, TX (US); Polina Khalilova, Houston, TX (US); Larry Charles Todd, Magnolia, TX (US); Philippe Enkababian, Richmond, TX (US); Olivier Naud, Cheraga (DZ); Jean-Paul Mogou Dessap, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 351 days.

(21) Appl. No.: 15/358,891

(22) Filed: Nov. 22, 2016

(65) Prior Publication Data
US 2018/0142544 A1    May 24, 2018

(51) Int. Cl.
*E21B 47/005* (2012.01)
*E21B 47/00* (2012.01)
*G06F 17/50* (2006.01)
*E21B 33/14* (2006.01)
*E21B 43/25* (2006.01)

(52) U.S. Cl.
CPC .......... *E21B 47/0005* (2013.01); *E21B 33/14* (2013.01); *G06F 17/5009* (2013.01); *E21B 43/25* (2013.01)

(58) Field of Classification Search
CPC ...... E21B 47/0005; E21B 33/14; E21B 43/26; E21B 43/25; G06F 17/5009
See application file for complete search history.

(56) References Cited

U.S. PATENT DOCUMENTS

| | | | | |
|---|---|---|---|---|
| 2013/0345983 A1* | 12/2013 | Guo | .................. | G01V 5/104 702/8 |
| 2014/0052376 A1* | 2/2014 | Guo | .................. | E21B 47/00 702/11 |

* cited by examiner

*Primary Examiner* — Brad Harcourt
(74) *Attorney, Agent, or Firm* — Andrea E. Tran

(57) ABSTRACT

A method may include preparing a map of cement quality for one or more intervals of a wellbore; determining anticipated regions of fluid communication and anticipated regions of zonal isolation from the map of cement quality; and designing a stimulating treatment based on the presence of regions of fluid communication.

13 Claims, 11 Drawing Sheets

_US 10,557,341 B2_

METHODS OF EVALUATING CEMENT ISOLATIONS AND QUALITY

BACKGROUND

Following the cessation of drilling operations, completions may be initiated in which downhole tubulars and equipment are installed to enable the safe and efficient production from an oil or gas well. During completions, sections of casing or pipe string may be placed into the wellbore to enhance wall strength and minimize the chances of collapse, burst, or tensile failure. Well casings of various sizes may be used, depending upon depth, desired hole size, and types of geological formations encountered. The casing and other tubulars may, in some instances, be stabilized and bonded in position using various physical and chemical techniques.

When cement or other settable compositions are used to stabilize completion equipment, a portion of the drilling fluid may be removed from the wellbore so that the casings may be cemented in place. Primary cementing operations may fill at least a portion of the annular space between the casing and the formation wall with a hydraulic cement composition. The cement composition may then be allowed to solidify in the annular space, thereby forming an annular sheath of cement. During stimulation (such as hydraulic fracturing or other techniques), cement may provide an impermeable barrier that prevents the migration of stimulation fluids between zones to be stimulated in the wellbore. In some cases, when needed, cement may provide an impermeable barrier that prevents the migration of undesired fluids and gases (e.g., water) between zones penetrated by the wellbore during production. Other situations arise where cementing particular zones within a formation may be beneficial. For example, cementing operations may also include use of cement during remediation of lost circulation or zonal isolation.

SUMMARY

This summary is provided to introduce a selection of concepts that are described further below in the detailed description. This summary is not intended to identify key or essential features of the claimed subject matter, nor is it intended to be used as an aid in limiting the scope of the claimed subject matter.

In one aspect, embodiments disclosed herein relate to a method that includes preparing a map of cement quality for one or more intervals of a wellbore; determining anticipated regions of fluid communication and anticipated regions of zonal isolation from the map of cement quality; and designing a stimulating treatment based on the presence of regions of fluid communication.

In another aspect, embodiment disclosed herein relate to a method that includes preparing a simulated map of cement quality; determining anticipated regions of fluid communication; and designing a cementing operation based on the presence of anticipated regions of fluid communication.

In yet another aspect, embodiments disclosed herein relate to a method that includes preparing a map of cement quality for one or more intervals of a wellbore; comparing the map of cement quality to a map of completion quality and a map of reservoir quality; and designing a stimulating treatment based on the maps of cement quality, completion quality, and reservoir quality.

Other aspects and advantages of the disclosure will be apparent from the following description and the appended claims.

DETAILED DESCRIPTION

In one aspect, methods in accordance with this disclosure are directed to the design of completions methods that include the characterization of cementing jobs within an interval of a wellbore, and the design of subsequent fracturing operations. In another aspect, methods in accordance with the present disclosure are directed to the design of cementing jobs using modeling techniques that estimate the degree of isolation of various regions of the wellbore once the cement has been emplaced and cured. Methods in accordance with the may include techniques for valuating and determining cement hydraulic isolation, and combining the information with formation evaluation to minimize uncertainty with pinpoint accuracy when selecting regions for perforation and stimulation during subsequent operational stages. In one or more embodiments, methods may include the creation of a cement quality map for sections of a wellbore that may be used to optimize the formulation and placement of a cementing job and/or used to design stimulation operations that avoid cemented regions that have low quality or suboptimal hydraulic isolation.

In one or more embodiments, methods in accordance with the present disclosure may include performing a cementing job, characterizing the cementing job, preparing a map of cement quality that may indicate regions of fluid communication in the near and far wellbore areas, and designing a stimulating treatment based on the obtained data. In some embodiments, methods may be executed using computer software that optimizes the characterization of the degree of cement isolation in one or more zones within the wellbore, and may assist users in placement of perforations and other wellbore stimulation techniques that minimize interzonal communication in the near- and far-wellbore. Computer software in accordance with the present disclosure may incorporate cement isolation information, including generating cement quality maps for a given wellbore.

Figure 1:
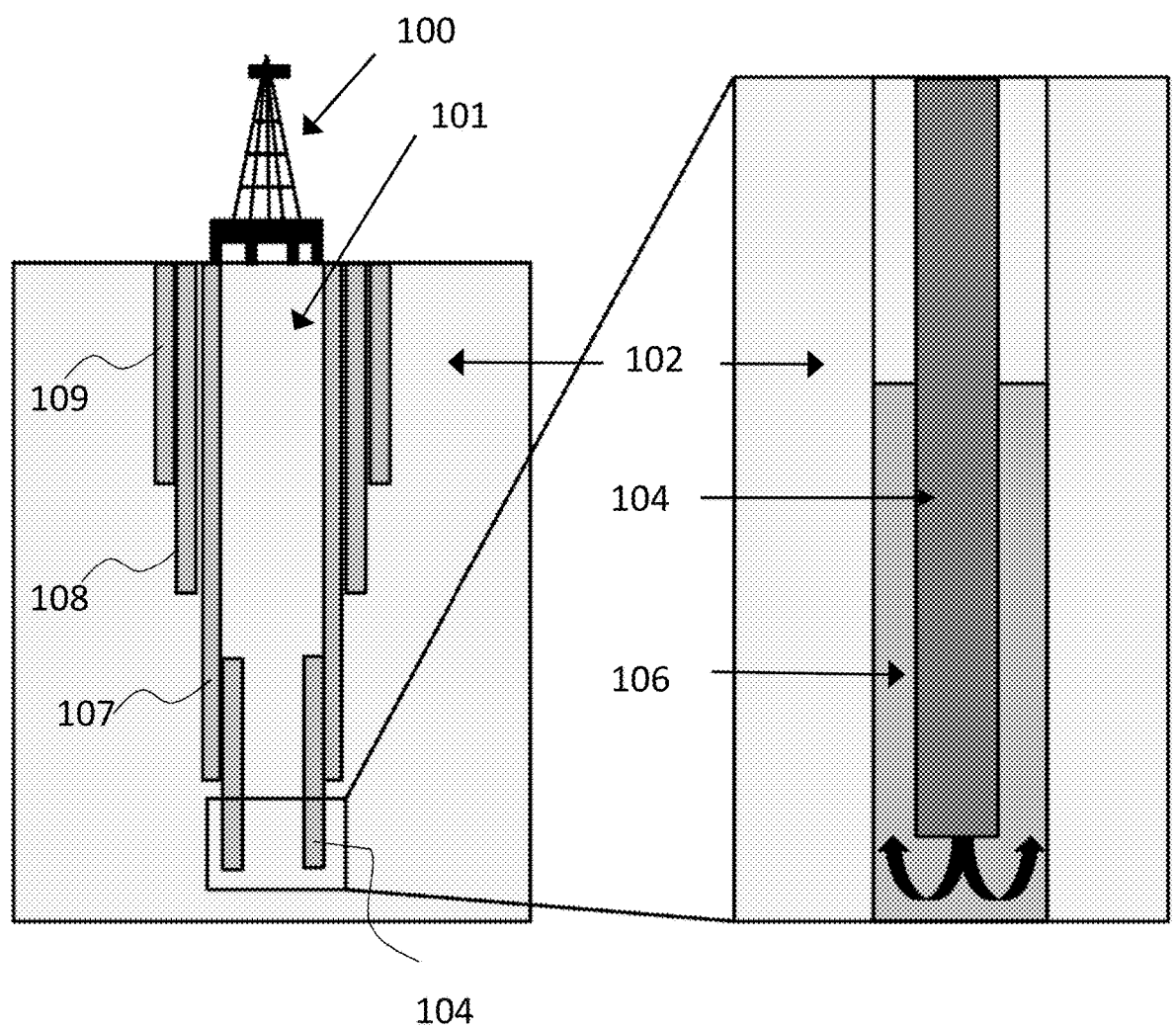
FIG. 1 is an illustration of a completions operation in which cement is installed in an annular region created between a borehole and an installed casing in accordance with embodiments of the present disclosure.

Cementing operations may proceed by emplacing a cement within a wellbore, such as in an annulus created between a wall of the formation and a section of installed casing. With particular respect to FIG. 1, a derrick 100 is shown installed on a wellbore 101 traversing a formation 102. Within the wellbore 101 casing strings 109, 108, 107 & 104 are nested within each other. Casing 104 was run as the last string (production casing or liner) in preparation for installation of a cement sheath between the outside of the casing and the exposed formation and/or other emplaced casing strings (i.e. 107). During the cementing operation, a cement slurry 106 is pumped into an annulus formed between formation 102 and the casing 104. In some embodiments, cement slurry may be pumped into multiple annular regions within a wellbore such as, for example, (1) between a wellbore wall and one or more casing strings of pipe extending into a wellbore, or (2) between adjacent, concentric strings of pipe extending into a wellbore, or (3) in one or more of an A- or B-annulus (or greater number of annuli where present) created between one or more inner strings of pipe extending into a wellbore, which may be running in parallel or nominally in parallel with each other and may or may not be concentric or nominally concentric with the outer casing string.

Figure 2:
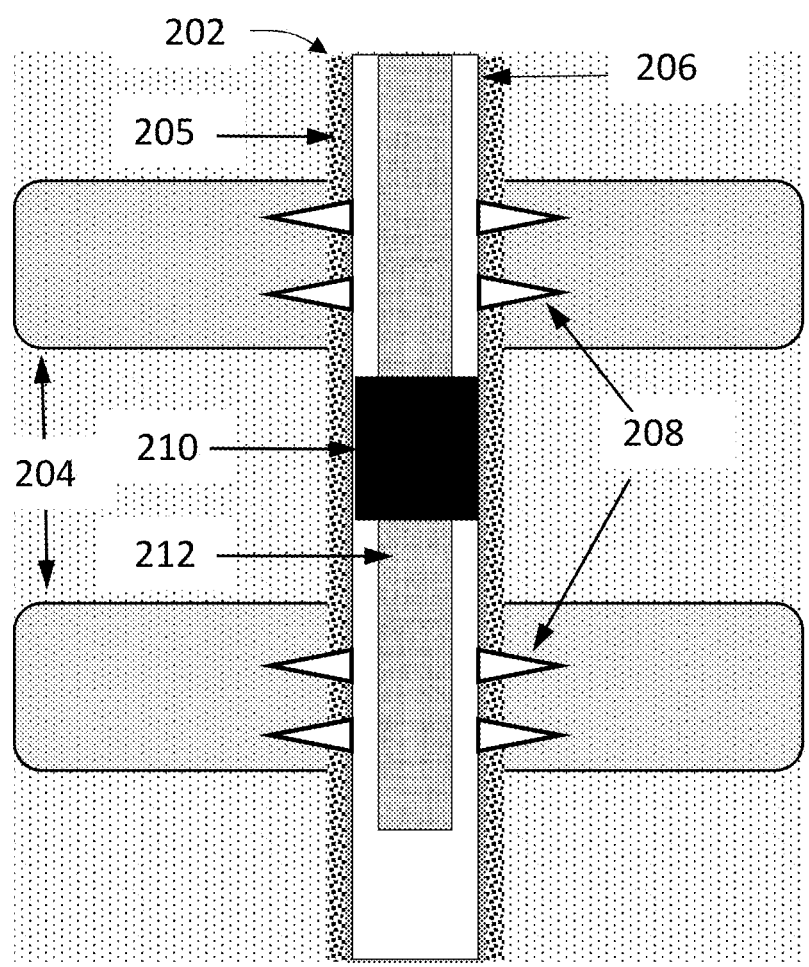
FIGS. 2 and 3 are graphic depictions illustrating a fracture operation in accordance embodiments of the present disclosure.

During wellbore stimulation, a wellbore may be perforated in a number of different locations in order to increase production, either in the same hydrocarbon-bearing zone or in different hydrocarbon-bearing zones, and thereby increase the flow of hydrocarbons into the well. Within a single wellbore, there may be one or more zones of interest within various subterranean formations or multiple layers within a particular formation. With particular respect to FIG. 2, a wellbore 202 may traverse one or more zones of interest 204. After drilling, a casing 206 may be lowered into the wellbore 202, and the wellbore 202 may be filled with cement 205 to cement casing 206 in place. After the cementing operation is complete, a perforating tool may be lowered into the wellbore to create perforations 208 through a casing 206 and cement cement and into the near wellbore, in order to access/stimulate the zones of interest 204.

Stimulation may target single or multiple zones within the well at time through the use of various technologies. For example, stimulation may involve multiple steps such as running a perforating gun down the wellbore to one or more target zones, perforating the target zones, removing the perforating gun, treating the target zones with a hydraulic fracturing fluid, and then isolating the perforated target zones for subsequent production. Plug and perforation operations often utilize the installation of plugs inside the casing and/or liner to isolate a target zone for stimulation from the remainder of the well. Plugs and packers may be used to isolate regions of the wellbore to minimize the risk of fracturing fluid by-passing the plug and damaging the wellbore through overflushing at elevated pressures, which can stimulate collateral intervals around the target.

The plug and perforation process may be repeated for all the target zones or a subset of target zones of interest until all the target zones are treated. However, production from multiple fractured intervals may encounter issues with control of the flow of fluids from the formation. For example, in a well producing from a number of separate zones (or from laterals in a multilateral well) in which a high pressure zone may neighbor a low pressure zone, the higher pressure zone may disembogue into the lower pressure zone rather than to the surface, potentially damaging the zone and limiting production. Similarly, in a horizontal well that extends through a single zone, having perforations near the "heel" of the well, i.e., nearer the surface, may begin to produce water before those perforations near the "toe" of the well. The production of water near the heel may then reduce the overall production from the well.

To remedy possible problems during stimulation, zones may be isolated with various tools such as a packer 210 emplaced on a string of tubing 212. Packers and other isolation elements such as bridge plugs and bull plugs may restrict flow from other intervals while stimulating a target interval. In some embodiments, intelligent completions may be used, which involves the use of liner systems, production packers, subsurface flow controls, and subsurface safety valves. Modern completion systems may also incorporate both sensing and control systems, inflow control devices (ICDs), flow control valves (FCVs), pressure gauges, and control lines that may allow users to drain their reservoirs with granularity and may provide an increased feedback regarding fluid movement and reservoir drainage.

Figure 3:
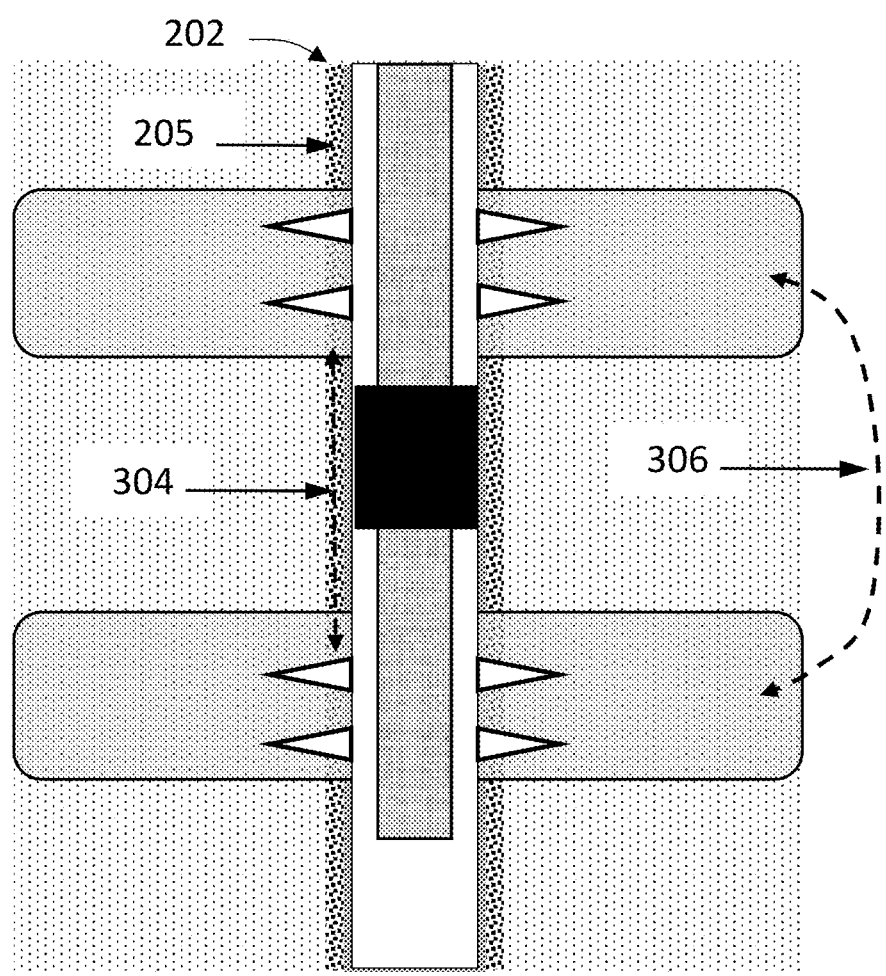

However, the use of isolation techniques and intelligent completion systems within the wellbore may have limited effectiveness in situations in which the cementing job behind the casing that isolates the sections from the formation is incomplete or defective. Following cementing operations in normal course, cementing characterization techniques may not consider cement isolation following emplacement, instead considering only formation properties, which may not reveal near-fluid communication between intervals, which can lead to uncertainty with regard to the level of fluid communication between zones, particularly after one or more zones have been perforated during stimulation operations. For example, with particular respect to FIG. 3, defects in primary cementing jobs may result in the formation of channels and microannuli that allow fluid communication through mud channels left in the wellbore 202 or through cracks 304 within the cement 205. Further, depending on a number of factors, such as spacing between fractured intervals and the nature of the formation, vugs and other natural channels may lead to far-wellbore fluid communication 306 as well, though, such communication may be dependent on the formation and not a result of cement issues. Such problems may not be evident following cementing and fracturing operations, and cement characterization is rarely if ever performed prior to subsequent operations. The end result then is that an operator may underestimate the degree of fluid connectivity between perforated intervals, which can result in issues that impact overall production.

Methods in accordance with the present disclosure may look at zonal isolation quality following cementing operations. In one or more embodiments, well geometry, washout, mud quality, cements and spacers quality, flow rates, centralization of casing string and other variables may be used to create cement quality maps that will be used as a predictive aid to quantify zonal isolation to enable informed design decisions for subsequent fracturing operations. In some embodiments, cement quality maps may be used to prepare fracturing operations such as plug-and-perf operations to enhance production. Cement quality maps may be used as a metric to quantify the zonal isolation confidence factor (ZIF), which may be used with other criteria such as reservoir quality (RQ) and completion quality (CQ) to enable informed design decisions for subsequent fracturing operations in some embodiments.

In one or more embodiments, evaluation logs such as open hole logs or logging-while-drilling logs, surface measurements, cementing placement data and cement density/bond log, variable density log, and/or ultrasonic cement log (such as from a USI™ UltraSonic Imager Tool or by IsolationScanner™, both of which are commercially available from Schlumberger Technology Corporation) may be correlated and analyzed in a single workflow (such as INVIZION EVALUATION™, available from Schlumberger Technology Corporation) to create a cement quality map. In some embodiments, cement quality maps may provide a quantitative or qualitative estimation of the ZIF. In some embodiments, ZIF may be expressed in binary terms, and indicate whether hydraulic isolation is present or not present, i.e., whether there is good or poor cement quality. In some embodiments, ZIF may be expressed as a likelihood of hydraulic isolation, such as percent confidence of hydraulic isolation in the range of 0% to 100%.

In one or more embodiments, methods may be directed to integrated cement evaluation techniques that may consider a number of factors prior to and following placement of a cement composition within a wellbore. Methods in accordance with the present disclosure may include the creation and design of cement quality maps that may guide the user during the cement formulation and installation process in some embodiments, and/or cement quality maps may be generated from cement logs of an existing cement job and used to design subsequent stimulation operation. Relevant data used to generate cement quality maps in accordance with the present disclosure include open hole data, post placement cement forecasts, cased hole evaluations, cementing placement data and cement density/bond log, variable density log, and/or ultrasonic cement log (such as from a USI™ UltraSonic Imager Tool or by IsolationScanner™, both of which are commercially available from Schlumberger Technology Corporation).

Methods in accordance with the present disclosure may optimize wellbore stimulation operations by analyzing cement isolation data when evaluating stimulation treatment design data and performing calibration based on determined conditions in the wellbore such as pressure and temperature. Methods in accordance with the present disclosure may consider a number of factors regarding emplaced cement jobs such as the quality of the bond to the casing, the anticipated level of hydraulic communication during subsequent wellbore operations including stimulation and fracturing, and the like.

Methods in accordance with the present disclosure may deliver cement evaluations with a reduced level of uncertainty as to the level of hydraulic isolation and may be used to calibrate formation data with pinpoint accuracy. In some embodiments, methods may include cement emplacement and stimulation design according to the results of the cement isolation characterization.

In one or more embodiments, cement characterization techniques may be reactive and focused on characterizing an existing cementing job prior to aiding in the design and execution of a stimulation operation. In some embodiments, hydraulic isolation may be characterized in conjunction with other formation evaluation techniques and used to design stimulation operations, including placement of perforations and completions design. Cementing characterization techniques may be developed from open-hole data, post-placement cement forecasts, and the like. In some embodiments, information obtained from cement hydraulic isolation characterization may be used with other information used in the design of stimulation treatments including open-hole and cased-hole evaluations, wellbore geometry, and formation properties.

In embodiments in which cement quality maps are incorporated into a wellbore operation design suite, cement quality maps may define the condition of cement sheath behind the casing, such as the degree of hydraulic isolation along the wellbore, and enable users to consider cement quality in addition to relevant formation properties when determining the placement of perforations in fracturing operations. In some embodiments, formation characterization may be calibrated with pinpoint accuracy, minimizing uncertainty related to concerns about cement isolation and allowing targeted placement of perforations and other stimulation treatments.

In one or more embodiments, field completion plans may be optimized based on updated stimulation/formation data obtained following a cement job. During cementing operations, intervals within a wellbore, such as in a horizontal section, may have insufficient standoff (i.e. centralization of a casing string in wellbore), which may create fingering and channeling of a cement-forming slurry that results in porous structures that enable fluid communication. Cementing jobs may also be modified in some embodiments through the installation of agitators, such as turbolizers, or centralizers within selected zones to minimize channel formation, or through the use of practices such as reciprocation, rotation, and/or vibration of the casing string to minimize channel formation.

In some embodiments, methods may involve selecting fracturing stages along the wellbore above or below plug depths or between cemented sleeves where cement isolation is acceptable. Methods in accordance with the present disclosure may also involve the design of preparatory and remediating treatments for stimulation treatment stages. For example, diversion treatments such as fiber pills or chemical diverters may be used to treat near- or far-wellbore fluid and pressure loss prior to or during stimulation treatments.

Figure 4:
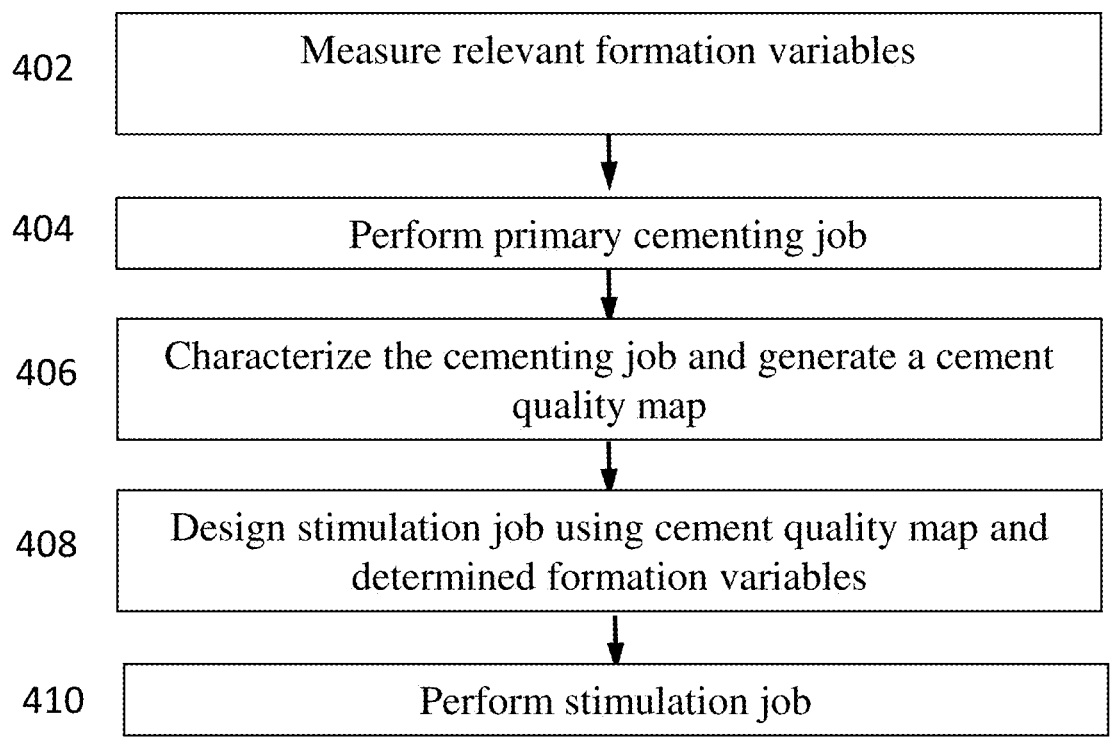
FIG. 4 is a schematic depicting a flow diagram in accordance with embodiments of the present disclosure.

With particular respect to FIG. 4, a flow diagram of a stimulation design method in accordance with the present disclosure is shown. During the initial stages, formation variables are collected at 402 from a number of sources including information from logging-while-drilling, cuttings analysis, acoustic and radioactive measurements, and the like. Next, primary cementing is performed at 404 following the installation of tubulars (e.g. casing string) and other wellbore equipment. Once primary cementing is completed, the cementing job is characterized at 406 using an appropriate technique such as a cement density/bond log, variable density log, and/or ultrasonic cement log (such as from a USI™ UltraSonic Imager Tool or by IsolationScanner™, both of which are commercially available from Schlumberger Technology Corporation), and a map of cement quality is generated. However, in other embodiments, the cementing job is characterized at 406 based on the computer simulation of mud cleaning/displacement and the cement slurries being pumped to generate a cement quality map. It is also envisioned that the computer simulations may be used in combination with cement logs. The cement quality map may then inform the stimulation job design at 408, which may include importing the cement quality map into stimulation design software. The stimulation job is then designed, taking into account, for example, the presence of cemented intervals that may have less than optimal levels of expected hydraulic isolation when planning the placement of perforations, or decision on opening or not frac valves, packers and other equipment to minimize complications in later production operations. That is, if a particular interval has less than desirable cement quality to achieve zonal isolation (but acceptable quality above and below the interval), the stimulation may be designed (or modified) to stimulate such interval (e.g. to adjust a depth of perforation interval or decision on opening or not frac valves or sliding sleeves).

After the quality of the cementing job has been appraised or the cement quality map considered, stimulation operations may be designed, for example, using diversion or sequential fracturing techniques of any type (such as, but not limited to use of sliding sleeves such as with BROADBAND™ services available from Schlumberger Technology Corporation, frac plugs such as with Plug-and-Perf services available from Schlumberger Technology Corporation, degradable frac balls, etc.). However, it is also envisioned that other fracturing techniques may be used. Stimulation design may involve setting the number and distance between the perforations for each perforation stage, which may involve placement of perforations or wellbore bridge plugs at regions having acceptable hydraulic isolation. Given that some of such techniques involve installation of the completion equipment prior to pumping the cement, use of a predictive cement quality map (based, for example, on mud displacement) may aid in the selection and placement of the completion equipment within the well.

During stimulation operations, pressure, temperature, and fluids may be monitored to determine the presence of fluid communication between stages, including near and far field effects. In addition, wellbore clean out may be monitored for the presence of sands in some embodiments. In some embodiments, wellbore cleanout may be monitored for the presence of sand. For example, the presence of sand may be correlated with poor zonal isolation where fluid communication exists above and below an installed packer and may indicate that injected fluids may enter other regions beyond that targeted.

Other evidence of fluid communication between zones may include data from production monitoring. For example, the contribution of fracture clusters to production may be monitored for poor production, which may be an indication that formation fluids were being produced elsewhere for any number of reasons such as poor zonal isolation for stimulation or that proppant installation was unsuccessful due to leakoff. Production monitoring may involve monitoring data from pressure measurements and changes, logging cleanout, production logs, and spinner logs for fluid composition changes such as the introduction of water and brines. In addition, changes in pressure and temperature that may also indicate fluid communication with other zones. In some embodiments, fluid communication may be compared to that predicted from post-job displacement simulation software such as WELLCLEAN™ (WELLCLEAN II™, WELLCLEAN III™), 3D APERTURE™, and CEMENTICS™ available from Schlumberger Technology Corporation.

In one or more embodiments, data obtained before and during stimulation operations may be analyzed to determine the existence and level of fluid communication between wellbore stages, including near-wellbore and far-field effects. In some embodiments, fluid communication between wellbore stages may be compared with the results of a number of wellbore evaluation techniques including cement evaluation logs captured from ultrasonic imaging tools, isolation scanners, cement bonding logs, variable density logs, and the like.

Methods in accordance with the present disclosure may integrate the analysis of cementing job quality with the stimulating operations, including perforation and fracture design. In one or more embodiments, cement evaluation techniques may be used to develop a cement quality map that may be incorporated into downstream software used to design fracturing operations. Inputs used to develop cement quality maps may be generated from cement quality logs such as cement bonding logs (CBL), variable density logs (VDL), ultrasonic logs and the like. Other inputs for developing cement quality maps may include simulated logs of anticipated cement quality such as synthetic CBL or simulations of displacement.

Figure 5:
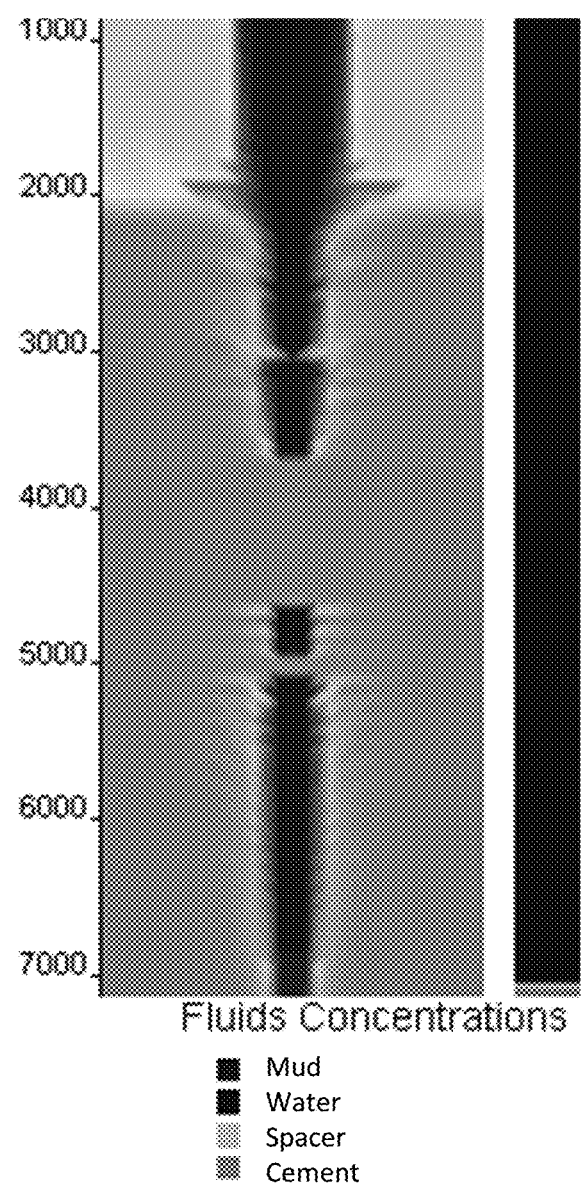
FIGS. 5-7 show simulated fluid concentration maps in accordance with embodiments of the present disclosure.
Figure 6:
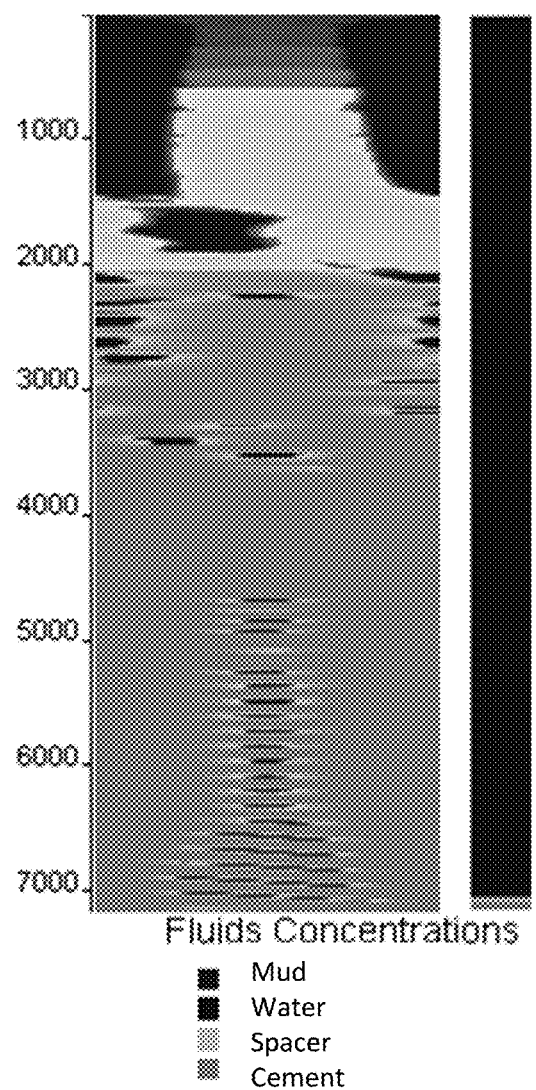
Figure 7:
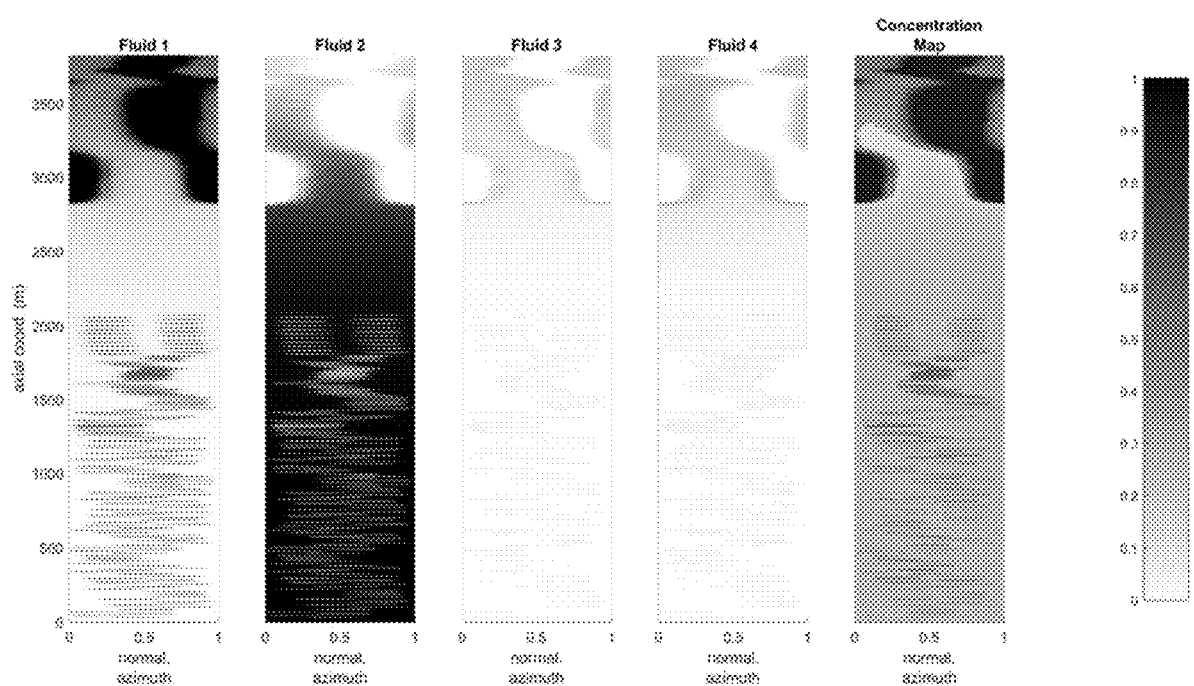

Predictive methods in accordance with the present disclosure may also include computer simulation of mud cleaning prior to primary cementing, which may estimate the degree of mud removal based on existing wellbore equipment, mud characteristics, injected fluid composition and flow properties, and the like. Methods may include simulations of treatments such as post-placement treatment that may include the use of annular displacement simulation software such as WELLCLEAN™ (WELLCLEAN II™ WELLCLEAN III™), 3D APERTURE™, and CEMENTICS™ available from Schlumberger Technology Corporation. WELLCLEAN™ is a numerical cement placement simulator uses computational fluid dynamics to design the process of cement placement. For example, referring now to FIG. 5, a simulation may generate a fluids concentration map, showing a mapping of fluids (such as mud, water, spacer fluid, and cement) in the well based on well geometry and trajectory, downhole fluid properties, volumes, pump rates and casing centralization. Thus, with such simulation, users may predict the efficiency of mud removal and identify whether a mud channel will remain. In some embodiments, the output from software such as WELLCLEAN™ may also be compared to a map of stimulations sleeves for verification. 3D APERTURE™ simulates the mud displacement in three dimensional space. The simulator resolves azimuthal flows around the full annulus allowing simulation of gravity-induced segregated flow in horizontal and deviated wells, such as that shown in FIG. 6. Further, it is also envisioned that a three-dimensional fluid concentration map may be broken out into each of the fluid phases present, as shown in FIG. 7. These fluid concentration maps, showing simulations of mud displacement may be predictive cement quality maps in accordance with the present disclosure.

Predictive methods in accordance with the present disclosure may allow users to adjust cement design to ensure hydraulic isolation around zones targeted for completions, minimize fluid connectivity following perforations, and minimize plugging and other production issues. Adjustments to a planned cementing job may include modifying the number of cementing stages, placement of centralizers and other equipment for smart installation techniques, or changing the fluid's design including rheological properties, thickening time, compressive strength, free fluid, fluid loss and compatibility with other fluids. In some embodiments, a synthetic cement quality map may be generated based on formation properties and cement composition. Synthetic cement quality maps may be integrated into completion design software in some embodiments and used to determine whether the cementing job will be sufficient or should be modified or upgraded.

Other factors that may be considered in cementing design include fluid rheology, torque, and drag when installing equipment such as centralizers and tubing, the presence of completion hardware such as sleeves and screens, fluid flow during mud removal, the need for remedial measures such as pills and diverters, and the like. Cementing operation design may also include factors such as market pricing, material properties, component availability, operating conditions, chemical compatibilities, and the like.

In one or more embodiments, predictive modeling techniques may include constructing a model prior to a cementing job, calibrating the model to pressure and rate measured or anticipated in a target interval, and interpreting existing formation evaluation logs. In some embodiments, predictive or "synthetic" cement quality maps may be used to select types of cements based on formation properties and wellbore logs. For example, in some embodiments, completions design may be adjusted based on available cement quality or based on performance at pressures and temperatures in a given wellbore interval.

In one or more embodiments, software suites may be used to analyze logs or simulate cementing results to create synthetic cement quality maps. In one or more embodiments, synthetic cement quality maps may be generated using commercial cementing software such as CEMCAST™ and displacement simulation software such as WELLCLEAN™ (WELLCLEAN II™, WELLCLEAN III™), 3D APERTURE™, and CEMENTICS™ available from Schlumberger Technology Corporation, and programs that generate visual log measurements and model the output of cement quality including the MANGROVE™ plugin for PETREL™, all of which are available from Schlumberger Technology Corporation.

Figure 8:
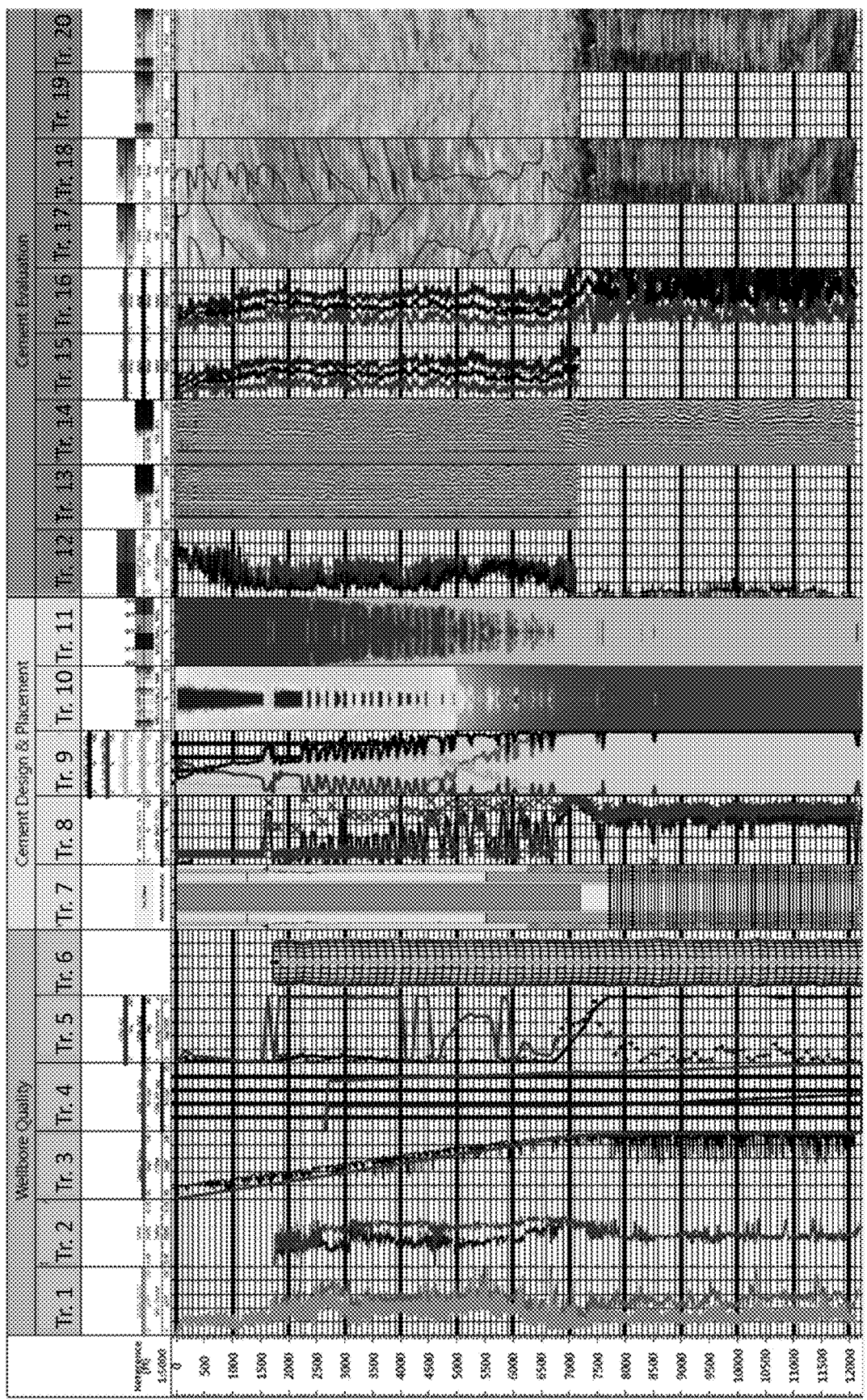
FIG. 8 is a schematic showing cement quality mapping in accordance with embodiments of the present disclosure.

Further, in one or more embodiments, the cement quality maps may incorporate predictive simulations in combination with cement logs as well as other well quality maps to produce a comprehensive cement quality map within a single workflow, (such as INVIZION EVALUATION™, available from Schlumberger Technology Corporation). For example, referring to FIG. 8, an example of such single workflow is shown. FIG. 8 includes well quality tracks 1-6, cement design and placement simulation tracks 7-11, and cement evaluation tracks 12-20. Specifically, related to well quality, track 1 includes a gamma ray log, track 2 includes a density and porosity log, track 3 includes a formation temperature log, track 4 includes pore pressure/fracture gradient, track 5 includes well geometry (inclination, azimuth, and dog legs), and track 6 includes borehole shape. Related to cement design and placement simulation, track 7 includes a well schematic, track 8 includes standoff at centralizers, track 9 includes fluid coverage (including muds, spacers, slurries, etc.), track 10 includes a fluid concentration map (including muds, spacers, slurries, etc.), and track 11 includes a risk of mud on wall. Related to cement evaluation logs, track 12 includes a cement bond log (at both 0 and 1500 psi), track 13 includes a variable density log (at 0 psi), track 14 includes a variable density log (at 1500 psi), and tracks 15-20 include acoustic impedance maps.

In one or more embodiments, fluid communication between zones may be quantified, which can provide estimates in the degree of production decrease and fluid diversion rates between zones. For example, the communication between stages may be compared with production data in order to determine the change in overall production rates and whether remediation or intervention is necessary. In some embodiments, zonal isolation quality may be characterized by a bond index describing the degree of cement bonding, defined herein as a "bond index" (BI), between the casing and formation, or between concentric casings in some cases. BI values in accordance with the present disclosure may range from 0%, representing no bond between cement and casing and no hydraulic isolation, to 100%, representing complete cement bonding and hydraulic isolation. Based on application requirements, an operator may subdivide the BI into various subranges such as acceptable and unacceptable. For example, in some embodiments, acceptable BI values may be in the range of 80% to 100%, however, depending on the application, the acceptable range of BI values may be broader or narrower.

In one or more embodiments, characterization of hydraulic isolation may involve determining the level of cement quality from a number of factors such as bond index, which may be based on CBL readings, along with other information sources such as VDL data, and output from ultrasonic tools that include USIT, ISOLATIONSCANNER™, and the like. In some embodiments, cement quality factors may be derived from open hole or LWD evaluation logs, surface measurements, cementing placement data, and cement bond logs, or a subset or mixtures thereof, and may be correlated and analyzed in single workflow to determine the hydraulic isolation quality.

In one or more embodiments methods in accordance with the present disclosure may involve the design of single and multistage fracturing treatments that consider formation properties and cement quality behind installed casing. In some embodiments, stimulation treatments may be designed such that fracturing stages are placed in wellbore regions having known degrees of hydraulic isolation behind the casing, including at, above, and below the stage in some cases. In some embodiments, stimulation design may involve sequential fracturing operations such as BROADBAND™ sequential fracturing services available from Schlumberger Technology Corporation, or the use of diverters and other treatments including fiber and/or particulate pills, chemical treatments, and the like to prevent fluid communication between zones during stimulation.

In one or more embodiments, stimulation design data may be optimized by considering cement isolation data and formation information obtained from log data, pressure measurements, temperature, and other factors. For example, fluid communication between stages, including from near- and far-field wellbore regions, which may in turn be used to estimate cement quality and may inform placement of fracturing stages. Fluid communication measured between stages by, for example, monitoring pressure and temperature changes may be compared with cement evaluation logs such as ultrasonic imaging techniques such as Schlumberger's ISOLATION SCANNER™, cement bond logs, and variable density logs. In one or more embodiments, fluid communication between stages may be analyzed following primary cementing operations from simulations created using specialized oilfield software such as 3D APERTURE™.

Methods in accordance with the present disclosure may use commercially available cementing software such as INVIZION™ or similar. Wellbore simulations may be conducted on software such as WELLCLEAN II™ WELLCLEAN III™, 3D APERATURE™, CEMENTICS™ (all of which are available from Schlumberger Technology Corporation) or similar that is capable of using inputs that can correlate the state of wellbore (diameter, washouts, and the like) and centralization prediction such as caliper logs, synthetic caliper log, or any other log providing similar information regarding the status of the wellbore.

In one or more embodiments, wellbore-specific software suites may be used to generate a cement quality map from one or more logs and simulation results. In some embodiments, cement quality maps may be stored in a common database using commercial software packages such a STUDIO™. Cement quality maps may then be accessed by fracturing design software to access the cement quality maps, which may provide a user with information regarding cement quality during the design of single and multistage fracturing treatments.

In one or more embodiments, methods in accordance with the present disclosure may be proactive, involving the design of a cementing job prior to emplacement and, in some cases, characterization of the cementing job prior to stimulation operations. In some embodiments, cementing operations may be optimized to ensure adequate strength and coverage within an annulus to prevent hydraulic communication between zones, and to withstand the forces exerted on the casing during stimulation.

In one or more embodiments, cement quality may be estimated predictively, prior to primary cementing. In some embodiments, cement quality maps may be estimated using know properties of the wellbore and installation equipment. Predictive methods of cementing may employ predictive models that generate an anticipated cement quality map from known wellbore data such as wellbore geometry and formation quality, and from equipment properties and variables such as pumping data and fluid characteristics. For example, by using information generated prior to and during drilling operations, the need to take cement logs following cement emplacement may be obviated in some embodiments, which may be advantageous in scenarios in which cement remediation will not be performed prior to initiating fracturing operations.

Methods in accordance with the instant disclosure may be applied to horizontal or sub-horizontal wells, including those with multi-stage fracturing completion. During cementing operations, isolation equipment such as packers and plugs may be installed within a wellbore, which may create isolated zones around sleeves in the tubing delivering a cement-forming slurry. Centralizers and other equipment to prevent tubulars and casing from contacting wellbore walls and other tubing may also be installed, particularly in the case of horizontal wells, to ensure adequate cement coverage. In some embodiments, methods in accordance with the present disclosure may utilize cement placement software to optimize the number of centralizers and other cementing equipment to enhance hydraulic isolation, which may include placement of equipment near anticipated perforation sites and other areas to improve cement installation.

In some embodiments, methods may reduce the total amount of centralizers without decreasing the degree of hydraulic isolation surrounding fracturing stages. Centralizer installation may be driven by plug or sleeve location in some embodiments, which may increase the likelihood of cement isolation in regions in which casing walls will be perforated and more susceptible to fluid communication between poorly cemented zones. In one or more embodiments, design parameters for cementing in accordance with the present disclosure may include having at least 5 casing joints centralized, where 2.5 joints reside above the plug and 2.5 joints reside below the plug, placing centralizers at a density of 2 centralizers per 1 joint. In some embodiments, centralizers and other supports may be provided in regions in which perforations will be located, proving a standoff 2.5 joints below the plug and 2.5 joints above a plug or packer. In some embodiments, a turbolizer may be combined with a normal centralizer, or a single-piece centralizer-turbolizer may be used on the first joint of the interval (if counted from the bottom), and combining centralization with casing movement technique.

Figure 9:
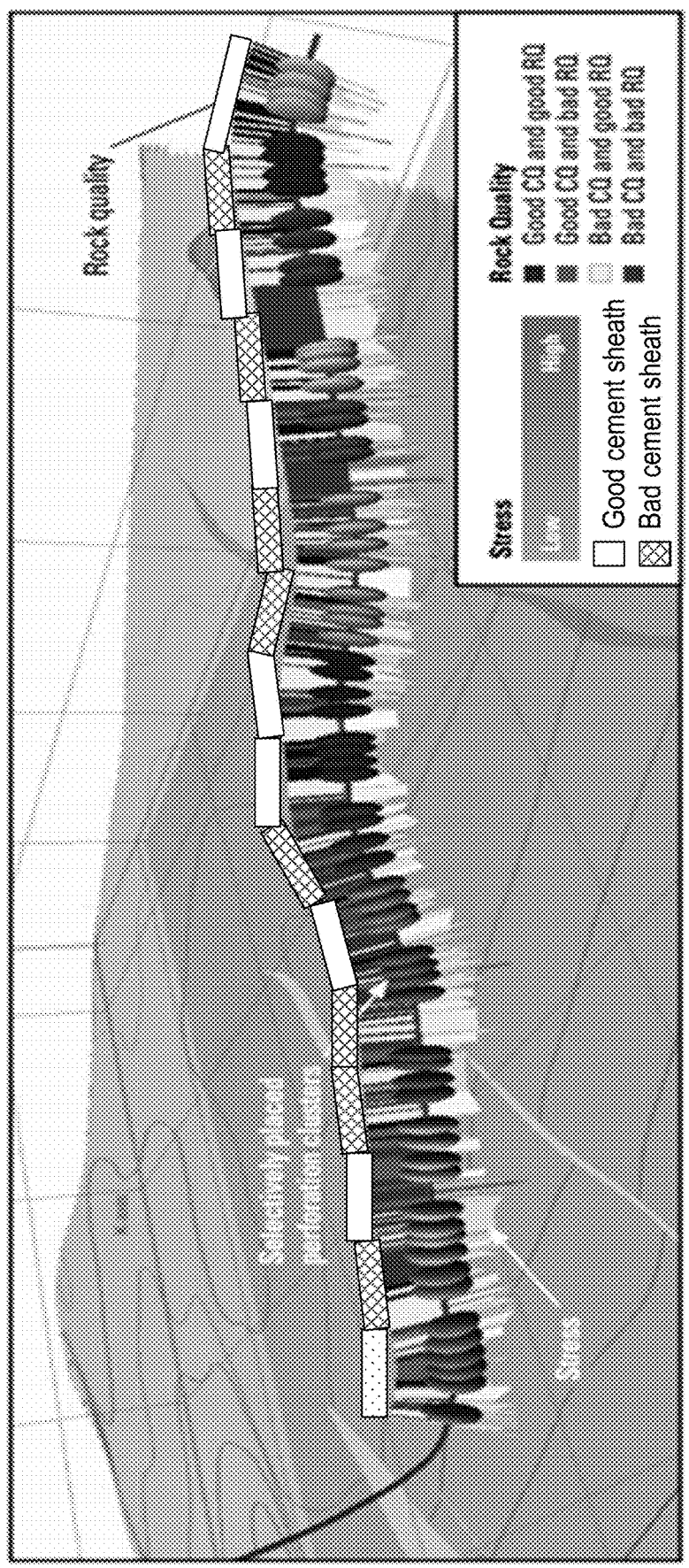
FIG. 9 is a schematic of a wellbore used in designing stimulation treatments in accordance with embodiments of the present disclosure.

Further, as mentioned above, cement quality maps of the present disclosure may be used as a metric to quantify the zonal isolation confidence factor (ZIF), which may be used with other criteria such as reservoir quality (RQ) (if the reservoir is good enough to be fracked, i.e., whether hydrocarbons are present) and completion quality (CQ) (whether the rock is conducive to being stimulated, considering, for example, mechanical prop of rock, Young's modulus, compressive strength, etc.) to enable informed design decisions for subsequent fracturing operations in some embodiments. Thus, for example, depending on the level of acceptable ZIF (between 0-100%), a stimulation operation may be designed not only based on the ZIF, but also considering the reservoir quality and the completion quality, as shown, for example, in FIG. 9. While the most desirable job would entail good ZIF, good RQ, and good CQ, the number of stages or clusters that would result from such requirement may not be adequate depending on the well. Thus, stimulations may be prioritized to choose from those where each of ZIF, RQ, and CQ are good, and secondly, where two of ZIF, RQ, and CQ are good, thirdly, where one of ZIF, RQ, and CQ are good and generally avoiding where none of ZIF, RQ, and CQ are good.

Figure 10:
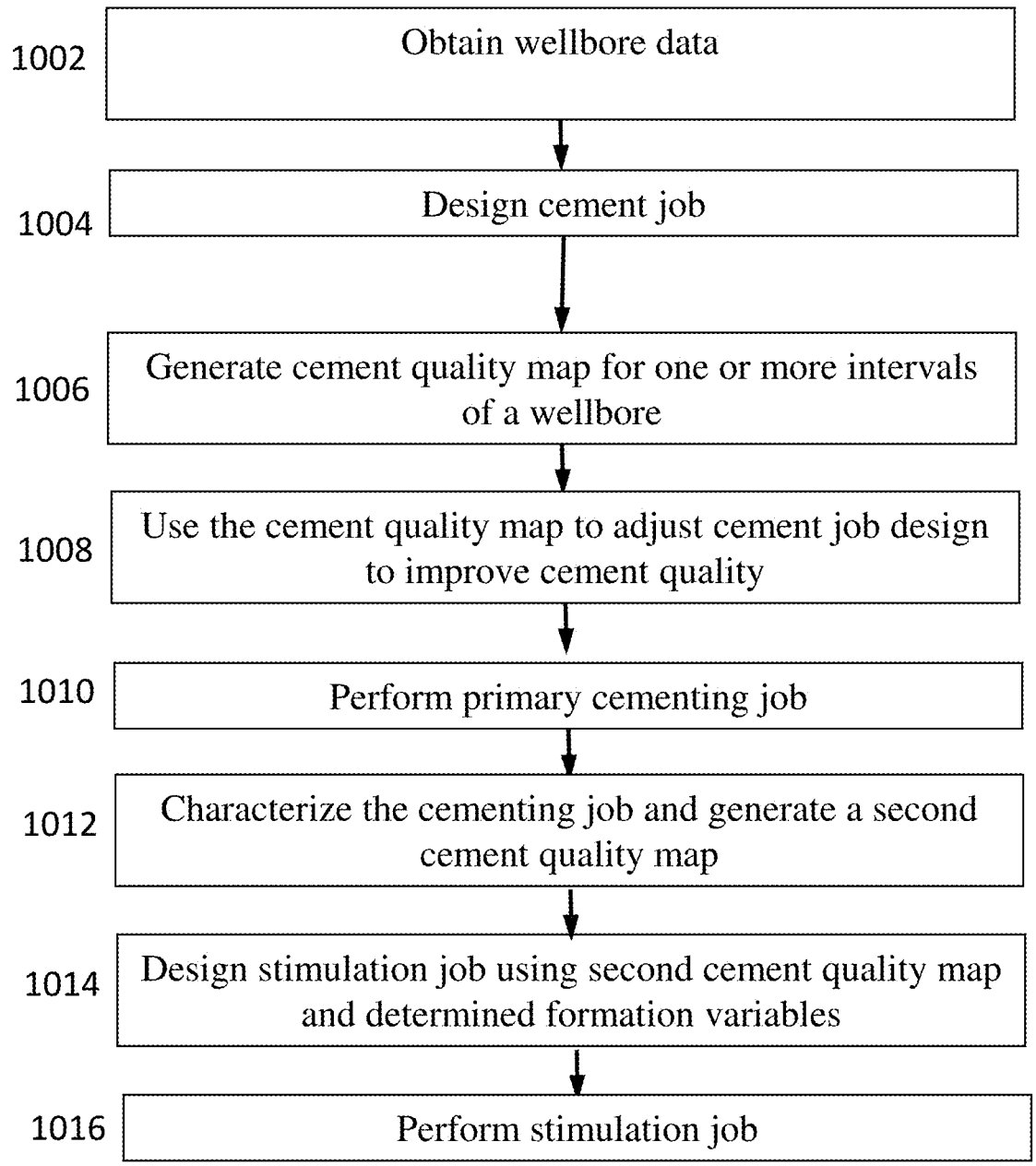
FIG. 10 is a schematic depicting a flow diagram in accordance with embodiments of the present disclosure.

In one or more embodiments, predictive methods may consider the initial wellbore condition following drilling operations and before primary cementing. In some embodiments, methods may be used to select and emplace cement within the wellbore. With particular respect to FIG. 10, a flow diagram for an embodiment of a method is shown in which information about the formation is used to design an optimized cementing job. During the initial stages, wellbore data is collected at 1002 from a number of sources including information from logging-while-drilling, cuttings analysis, acoustic and radioactive measurements, calipers, and the like. This information may include, for example, wellbore geometry, washout, etc. In addition, information may be collected regarding the type of cement used and other variables such as set time, particle size, the presence of hydration inhibitors or accelerants, the presence of structural additives such as fibers and particulates, and the like.

At 1004, an initial cement job is designed based on the expected wellbore, which may include, for example, a pumping schedule, cement formulations, spacers, surfactant packages, and orders of component addition. Based on the initial design, simulations of cement placement within the wellbore are performed using appropriate modeling software. In one or more embodiments, methods of designing a cementing job may also include simulation of torque and drag within the wellbore to determine the ability of running casing to the bottom of the wellbore with the selected centralizer setup. The available information may be used to construct a simulated or synthetic cement quality map at 1006 in some embodiments, which may anticipate regions of fluid communication in one or more of a near-wellbore region and a far-wellbore region if present. Cement quality maps are then used at 1008 to adjust the design of the cementing job including, for example, a pumping schedule, cement formulations, spacers, surfactant packages, and orders of component addition. In some embodiments, cement job design (and adjustment thereof) may also include the placement of cementing equipment such as tubulars, centralizers, and the like, and may evaluate the hierarch of friction and pressure within the system, allowing for the adjustment of piping diameter, the types of pumps required to deliver cement slurry, and similar factors.

Following adjustment of the cementing job design, the job may be performed at 1010 and, in some embodiments, evaluated using various logging and predictive techniques to ensure that installation occurred as planned and to verify the quality of hydraulic isolation. In some embodiments, the synthetic cement quality map generated at 1006 may also be used to design stimulation treatments at 1014 with or without further characterization of the emplaced cement job using cement logs and the like at 1012. However, it is also envisioned that a second cement quality map that incorporates the cement logs may be generated. The stimulation job may then be designed at 1014, including the placement of perforations, or decision on opening or not frac valves, packers and other equipment to minimize complications in later production operations. Such design may be based on the first and/or second cement quality map. Following stimulation job design, the job may be evaluated for feasibility and initiated at 1016.

Thus, embodiments of the present disclosure include both proactive and reactive completion and stimulation designs. In the proactive setting, predictive cement quality maps (alone or in combination with other factors such as RQ and CQ) may be used to assess whether the expected outcome will be sufficient or whether to modify the cement job design itself, such as through modifying the fluids, flows, casing reciprocation/rotation/vibration, centralization, etc. based on desired stimulation stages (for the RQ and CQ). Thus, desired stimulation based on RQ and CQ is used to modify the cement design through the use of the predictive cement quality maps. In a reactive design, cement quality maps (including either predictive maps or cement logs) may be used to design the stimulation treatment to avoid, for example, regions where fluid communication is anticipated. Rather, stimulation stages are desirably placed in regions of good cement quality. Further, when RQ is good, but ZIF is poor, it is envisioned that the stimulation techniques may be selected to overcome the poor cement quality (such as those involving a higher investment through the use of diversion techniques, etc.).

Cement Compositions

Cement compositions in accordance with the present disclosure may include cements, resins and other settable materials. Cement compositions may include mixtures of lime, silica and alumina, lime and magnesia, silica, alumina and iron oxide, materials such as calcium sulphate and Portland cements, and pozzolanic materials such as ground slag, or fly ash. Formation, pumping, and setting of a cement slurry is known in art, and may include the incorporation of cement accelerators, retardants, dispersants, etc., as known in the art, so as to obtain a slurry and/or set cement with desirable characteristics.

In a particular embodiment, cement compositions may incorporate a magnesium-based cement such as a "Sorel" cement. Magnesium-based cements are fast setting cements that approach maximum strength within 24 hours of contact with water. While not limited by any particular theory, the cement-forming reaction mechanism is thought to be an acid-base reaction between a magnesium oxide, such as MgO, and available aqueous salts. For example, mixing solid MgO and a brine containing $MgCl_2$ results in an initial gel formation followed by the crystallization of the gel into an insoluble cement matrix, producing magnesium oxychloride (MOC) cement. Other magnesium-based cements may be formed from the reaction of magnesium cations and a number of counter anions such as, for example, halides, phosphates, sulfates, silicates, aluminosilicates, borates, and carbonates. In some embodiments, anions may be provided by a magnesium salt of the selected anion.

In addition to MOC cements, prominent examples of magnesium-based cements also include magnesium oxysulfate (MOS) cements formed by the combination of magnesium oxide and a magnesium sulfate solution), and magnesium phosphate (MOP) cements formed by the reaction between magnesium oxide and a soluble phosphate salt, such as ammonium phosphate ($NH_4H_2PO_4$). Other suitable magnesium cements may also include magnesium carbonate and magnesium silicate cements. In one or more embodiments, magnesium cements may also include combinations of any magnesium cements described herein and those known in the art.

In other embodiments, the cement composition may be selected from hydraulic cements known in the art, such as those containing compounds of calcium, aluminum, silicon, oxygen and/or sulfur, which set and harden by reaction with water. These include "Portland cements," such as normal Portland or rapid-hardening Portland cement, sulfate-resisting cement, and other modified Portland cements; high-alumina cements, high-alumina calcium-aluminate cements; and the same cements further containing small quantities of accelerators or retarders or air-entraining agents. Other cements may include phosphate cements and Portland cements containing secondary constituents such as fly ash, pozzolan, and the like. Other water-sensitive cements may contain aluminosilicates and silicates that include ASTM Class C fly ash, ASTM Class F fly ash, ground blast furnace slag, calcined clays, partially calcined clays (e.g., metakaolin), silica fume containing aluminum, natural aluminosilicate, feldspars, dehydrated feldspars, alumina and silica sols, synthetic aluminosilicate glass powder, zeolite, scoria, allophone, bentonite and pumice.

In one or more embodiments, the set time of the cement composition may be controlled by, for example, varying the grain size of the cement components, varying the temperature of the composition, or modifying the availability of the water from a selected water source. In other embodiments, the exothermic reaction of components included in the cement composition (e.g., magnesium oxide, calcium oxide) may be used to increase the temperature of the cement composition and thereby increase the rate of setting or hardening of the composition.

Cement compositions may also include a variety of inorganic and organic aggregates, such as saw dust, wood flour, marble flour, sand, glass fibers, mineral fibers, and gravel. In some embodiments, a cement component may be used in conjunction with set retarders known in the art to increase the workable set time of the cement. Examples of retarders known in the art include organophosphates, amine phosphonic acids, lignosulfate salts, hydroxycarboxylic acids, carbohydrates, borax, sodium pentaborate, sodium tetraborate, or boric acid, and proteins such as whey protein.

Figure 11:
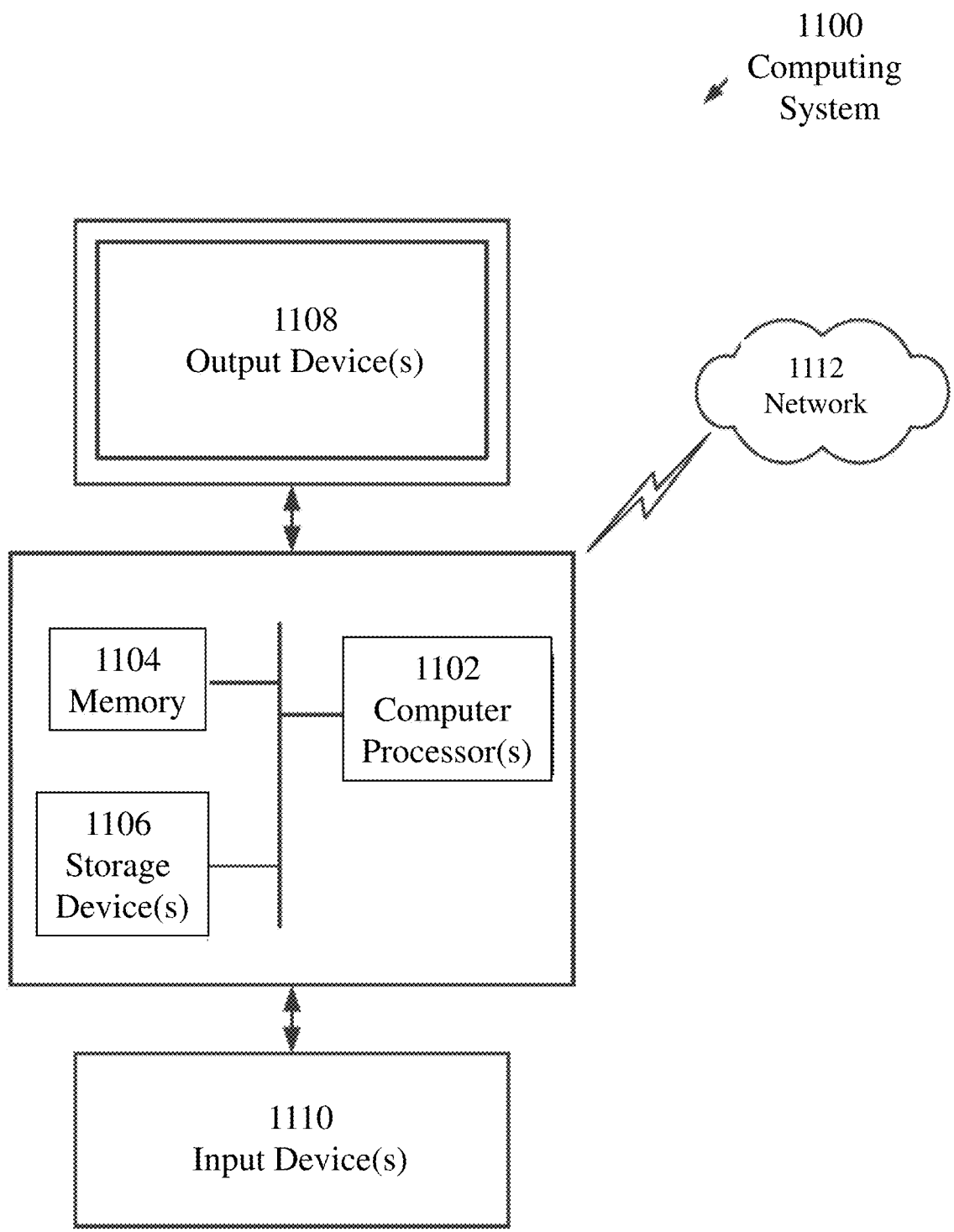
FIG. 11 is a computer system in accordance with embodiments of the present disclosure.

Embodiments of the present disclosure may be implemented on a computing system. Any combination of mobile, desktop, server, embedded, or other types of hardware may be used. For example, as shown in FIG. 11, the computing system (1100) may include one or more computer processor(s) (1102), associated memory (1104) (e.g., random access memory (RAM), cache memory, flash memory, etc.), one or more storage device(s) (1106) (e.g., a hard disk, an optical drive such as a compact disk (CD) drive or digital versatile disk (DVD) drive, a flash memory stick, etc.), and numerous other elements and functionalities. The computer processor(s) (1102) may be an integrated circuit for processing instructions. For example, the computer processor(s) may be one or more cores, or micro-cores of a processor. The computing system (1100) may also include one or more input device(s) (1110), such as a touchscreen, keyboard, mouse, microphone, touchpad, electronic pen, or any other type of input device. Further, the computing system (1100) may include one or more output device(s) (1108), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (1100) may be connected to a network (1112) (e.g., a local area network (LAN), a wide area network (WAN) such as the Internet, mobile network, or any other type of network) via a network interface connection (not shown). The input and output device(s) may be locally or remotely (e.g., via the network (1112)) connected to the computer processor(s) (1102), memory (1104), and storage device(s) (1106). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (1100) may be located at a remote location and connected to the other elements over a network (1112). Further, embodiments of the invention may be implemented on a distributed system having a plurality of nodes, where each portion of the invention may be located on a different node within the distributed system. In one embodiment, the node corresponds to a distinct computing device. However, the node may correspond to a computer processor with associated physical memory. The node may also correspond to a computer processor or micro-core of a computer processor with shared memory and/or resources.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method comprising:
preparing a map of cement quality for one or more intervals of a wellbore;
determining anticipated regions of fluid communication and anticipated regions of zonal isolation from the map of cement quality;
designing a stimulating treatment based on the presence of regions of fluid communication based on the map of cement quality created from one or more cement logs, wherein the designing the stimulating treatment comprises using diversion techniques at anticipated regions of fluid communication; and
performing the stimulation treatment.

2. The method of claim 1, further comprising: characterizing a cementing job within one or more intervals in a wellbore.

3. The method of claim 1, wherein the designed stimulating treatment places stimulation stages at anticipated regions of zonal isolation.

4. The method of claim 1, wherein the designed stimulating treatment avoids placing stimulation stages at anticipated regions of fluid communication.

5. The method of claim 1, wherein the one or more cement logs are selected from a group consisting of cement bonding logs, variable cement density logs, and ultrasonic cement logs.

6. The method of claim 1, wherein preparing the map of cement quality comprises simulating mud displacement.

7. The method of claim 1, further comprising: importing the map of cement quality into a software configured to design stimulating operations.

8. The method of claim 1, wherein the map of cement quality is based on presence or absence of hydraulic isolation, reservoir quality, or completion quality.

9. A method, comprising:
preparing a map of cement quality for one or more intervals of a wellbore;
comparing the map of cement quality to a map of completion quality and a map of reservoir quality;
designing a stimulating treatment based on the maps of cement quality, completion quality, and reservoir quality; and
performing the stimulation treatment.

10. The method of claim 9, wherein the designed stimulating treatment comprises stimulation stages placed at regions of having at least two of good cement quality, good completion quality and good reservoir quality.

11. The method of claim 9, wherein the designed stimulating treatment comprises stimulation stages placed at regions having good reservoir quality and poor cement quality with the use of diversion techniques where there is poor cement quality.

12. The method of claim 9, wherein the map of cement quality comprises a simulated map based on cement displacement.

13. The method of claim 9, wherein the map of cement quality comprises one or more cement logs selected from a group consisting of cement bonding logs, variable cement density logs, and ultrasonic cement logs.

* * * * *